(12) United States Patent
Chappo et al.

(10) Patent No.: US 11,656,372 B2
(45) Date of Patent: May 23, 2023

(54) QUANTUM DOT RADIATION DETECTOR MODULE WITH SELF-SUSTAINING POWER

(71) Applicants: KONINKLIJKE PHILIPS N.V., Eindhoven (NL); CASE WESTERN RESERVE UNIVERSITY, Cleveland, OH (US); WAYNE STATE UNIVERSITY, Detroit, MI (US)

(72) Inventors: Marc Anthony Chappo, Elyria, OH (US); Stephanie Lee Brock, Ferndale, MI (US); Ina Taylor Martin, Cleveland Heights, OH (US)

(73) Assignees: KONINKLIJKE PHILIPS N.V., Eindhoven (NL); WAYNE STATE UNIVERSITY, Detroit, MI (US); CASE WESTERN RESERVE UNIVERSITY, Cleveland, OH (US)

( * ) Notice: Subject to any disclaimer, the term of this patent is extended or adjusted under 35 U.S.C. 154(b) by 25 days.

(21) Appl. No.: 17/042,258

(22) PCT Filed: Mar. 27, 2019

(86) PCT No.: PCT/EP2019/057660
§ 371 (c)(1),
(2) Date: Sep. 28, 2020

(87) PCT Pub. No.: WO2019/185675
PCT Pub. Date: Oct. 3, 2019

(65) Prior Publication Data
US 2021/0141104 A1    May 13, 2021

Related U.S. Application Data

(60) Provisional application No. 62/650,315, filed on Mar. 30, 2018.

(51) Int. Cl.
*G01T 1/24* (2006.01)
*H01L 33/06* (2010.01)

(52) U.S. Cl.
CPC .............. *G01T 1/247* (2013.01); *G01T 1/244* (2013.01); *H01L 33/06* (2013.01)

(58) Field of Classification Search
None
See application file for complete search history.

(56) References Cited

U.S. PATENT DOCUMENTS

2010/0308328 A1    12/2010  Makihara
2011/0260237 A1    10/2011  Lee
(Continued)

FOREIGN PATENT DOCUMENTS

| RU | 134360 U1 | 11/2013 |
| WO | WO2008097272 A2 | 8/2008 |
| WO | WO2017025888 A1 | 2/2017 |

OTHER PUBLICATIONS

PCT International Search Report, International application No. PCT/EP2019/057660, dated Jun. 17, 2019.
(Continued)

*Primary Examiner* — Edwin C Gunberg
(74) *Attorney, Agent, or Firm* — Larry Liberchuk

(57) ABSTRACT

A radiation detector (100) includes a photovoltaic layer (102) with first and second opposing sides. The photovoltaic layer is configured to absorb first radiation at the first side and produce electrical charge. The detector further includes a porous silicon quantum dot layer (104) disposed at the second side of the photovoltaic layer and configured to receive second radiation and convert the received second radiation into an electrical signal indicative of an energy
(Continued)

level of the received second radiation. The detector further includes an acquisition and communication layer (106) disposed adjacent to the porous silicon quantum dot layer and configured to receive the electrical signal and transmit the electrical signal to a device remote from the radiation detector. The detector further includes an energy storage layer (108) disposed adjacent to the acquisition and communication layer and configured to store the electrical charge and supply the stored electrical charge as operating power to the acquisition and communication layer.

19 Claims, 5 Drawing Sheets

(56) References Cited

U.S. PATENT DOCUMENTS

| | | |
|---|---|---|
| 2013/0056705 A1 | 3/2013 | Kim |
| 2015/0338525 A1 | 11/2015 | Valentino |
| 2017/0306221 A1 | 10/2017 | Koolde |

OTHER PUBLICATIONS

Urdaneta M et al., "Porous Silicon-Based Quantum Dot Broad Spectrum Radiation Detector", Journal of Instrumentation, Institute of Physics Publishing, Bristol, GB, vol. 6, No. 1, Jul. 11-15, 2020.

Gardner D.S. et al., "Integrated On-Chip Energy Storage Using Passivated Nanoporous-Silicon Electrochemical Capacitors," Nano Energy, vol. 25, Sep. 13, 2015, pp. 68-79.

Bhandari K.P. et al., "Thin Film Solar Cells Based on the Heterojunction of Colloidal PbS Quantum Dots with CdS," Solar Energy Materials & Solar Cells, vol. 117, Jan. 25, 2013, pp. 476-482.

NoOzik A.J. et al.., "Semiconductor Quantum Dots and Quantum Dot Arrays and Applications of Multiple Exciton Generation to Third-Generation Photovoltaic Solar Cells," Chemical Reviews, vol. 110, Aug. 25, 2009, pp. 6873-6890.

Semonin O.E. et al. "Quantum Dots for Next Generation Photovoltaics," Materials Today, vol. 15, Issue 11, Nov. 2012.

Oakes L. et al., "Surface Engineered Porous Silicon for Stable, High Performance Electrochemical Supercapacitors," Scientific Reports, vol. 3, Article No. 3020, Jul. 24, 2011.

Gowda S.R. et al., "Building Energy Storage Device on a Single Nanowire," Nano Letters, vol. 11, No. 8, pp. 3329-3333, May 20, 2011.

QUANTUM DOT RADIATION DETECTOR MODULE WITH SELF-SUSTAINING POWER

FIELD OF THE INVENTION

The following generally relates to a multi-layer radiation detector module, and more particularly to a porous silicon (pSi) quantum dot (QD) radiation detector (pSi QD radiation detector) with self-sustaining electrical power, configured for remote unmanned ground and celestial applications.

BACKGROUND OF THE INVENTION

Present day radiation detectors are largely composed of crystal or garnet scintillators directly mounted to solid-state photodetectors such as photodiodes. The scintillator material produces light photons in response to bombardment with X-ray photons, which are then converted to electrical currents or pulses in the photodetector. Direct energy conversion materials with spectral discrimination made of cadmium zinc telluride (CZT) or cadmium telluride (CdTe) are also utilized for radiation detectors. More recently, nanoparticle research has led to a promising new technology in radiation detectors, namely quantum dots (QDs) inserted into porous silicon (pSi) to simultaneously improve performance and lower cost.

Lower power remote unmanned ground and outer space radiation detectors can be configured with a battery or the like for power. However, a battery has a battery life (i.e. a length of time before the original charge drops to a level insufficient to provide operating charge to the radiation detectors) and will require recharging (in the case of rechargeable battery still capable of being charged to a sufficient level) and/or replacement (in the case of a non-rechargeable battery or a rechargeable battery no longer capable of being charged to a sufficient level). In addition, these assemblies comprise large mass/volumes. Unfortunately, recharging and/or replacing such batteries in remote unmanned ground and outer space applications and/or large mass/volumes are not feasible.

SUMMARY OF THE INVENTION

Aspects described herein address the above-referenced problems and others.

In one aspect, a radiation detector includes a photovoltaic layer with first and second opposing sides. The photovoltaic layer is configured to absorb first radiation at the first side and produce electrical charge. The detector further includes a porous silicon quantum dot layer disposed at the second side of the photovoltaic layer and configured to receive second radiation, and then convert the received second radiation into an electrical signal indicative of an energy level of the received second radiation. The detector further includes an acquisition and communication layer disposed adjacent to the porous silicon quantum dot layer and configured to receive the electrical signal and transmit the electrical signal to a device remote from the radiation detector. The detector further includes an energy storage layer disposed adjacent to the acquisition and communication layer and configured to store the electrical charge and supply the stored electrical charge as operating power to the acquisition and communication layer.

In another aspect, a radiation detection and processing system includes an unmanned ground or celestial radiation detection module and a processing device. The unmanned ground or celestial radiation detection module includes a quantum dot photovoltaic layer configured to absorb first radiation and produce electrical charge. The unmanned ground or celestial radiation detection module further includes an energy storage layer configured to store the electrical charge. The unmanned ground or celestial radiation detection module further includes a porous silicon quantum dot layer configured to receive second radiation and produce an electrical signal indicative thereof. The unmanned ground or celestial radiation detection module further includes an acquisition and communication layer powered with the stored charge and configured to measure the electrical signal and convey the measurement off the detection module. The processing device is configured to receive and process the measurement, wherein the processing device is remote from the unmanned ground or celestial radiation detection module.

In another aspect, a method includes receiving, with a photovoltaic layer of a radiation detector, first radiation. The method further includes converting, with the photovoltaic layer, the received first radiation to electrical charge. The method further includes storing the electrical charge in an energy storage layer of the radiation detector. The method further includes powering an acquisition and communication layer of the radiation detector with the stored electrical charge. The method further includes measuring, with the powered acquisition and communication layer of the radiation detector, an electrical signal produced by porous silicon quantum dot layer in response to the porous silicon quantum dot layer absorbing second radiation and producing the electrical signal, which is indicative of the absorbed second radiation. The method further includes transmitting, with the acquisition and communication layer, data indicative of the measured signal off the radiation detector. In one instance, the data (which can be a raw and/or processed measurement) is processed by a device remote from the detector. It is to be appreciated that a photovoltaic layer can also be added to multiple sides of a cube or three-dimensional (3-D) module to increase energy absorption.

Still further aspects of the present invention will be appreciated to those of ordinary skill in the art upon reading and understanding the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF EMBODIMENTS

The following generally describes a radiation detector configured with a QD radiation conversion layer, a data acquisition and communication layer, a QD photovoltaic layer that generates charge, a power storage layer that stores the charge and supplies the stored charge to the data acquisition and communication layer to measure charge produced by the QD conversion layer and read out signals indicative thereof. In one instance, this pSi QD radiation detector is configured as a self-powering, low-power and compact unit for remote sensing and reporting in unmanned ground and/or outer space applications.

Figure 1:
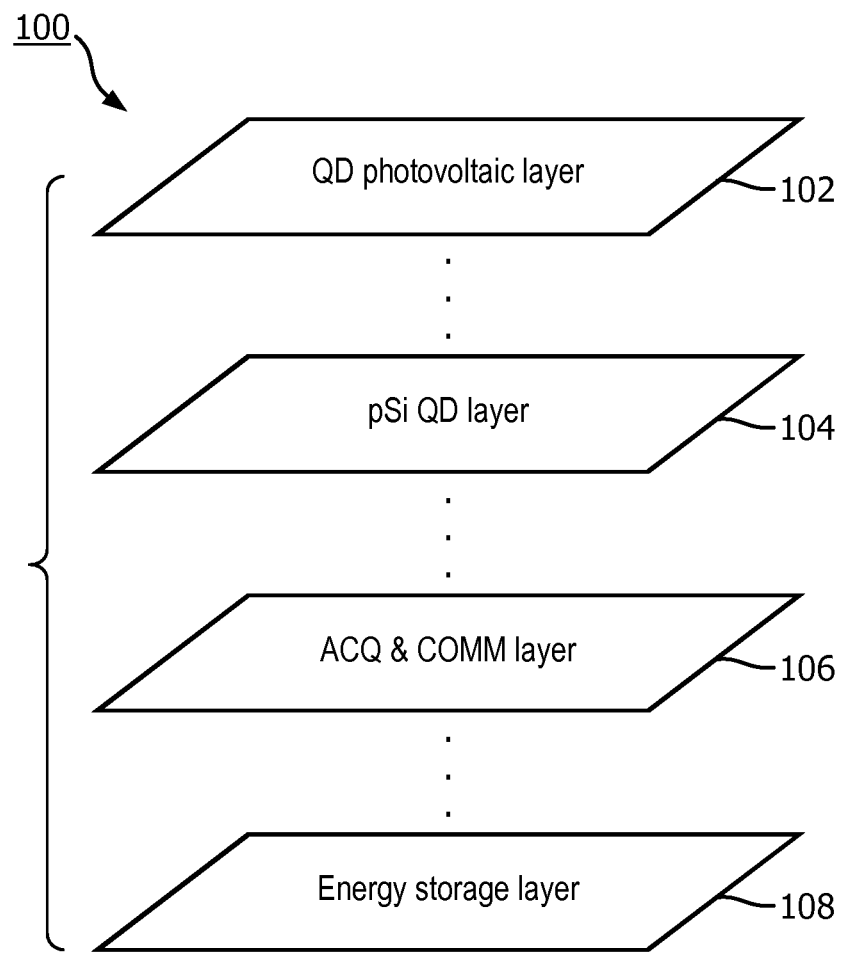
FIG. 1 schematically illustrates an exploded perspective view of example layers of an example QD-pSi radiation detector with self-sustaining electrical power for powering components of the QD-pSi radiation detector.
Figure 2:
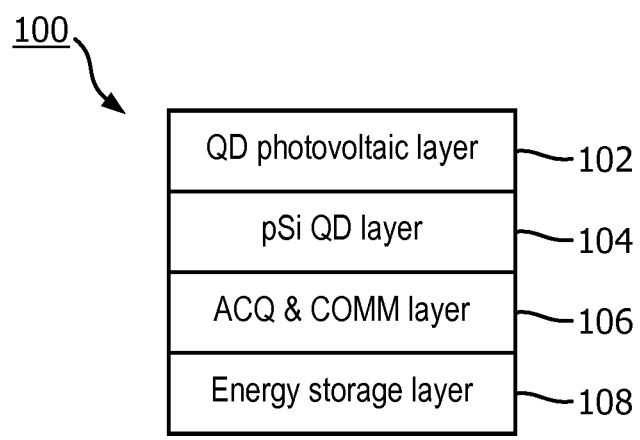
FIG. 2 schematically illustrates a front view of the example layers of the example QD-pSi radiation detector of FIG. 1.

FIGS. 1 and 2 schematically illustrate an example radiation detector 100 such as a pSi QD radiation detector. FIG. 1 schematically illustrates an exploded perspective view of individual layers shown as planes, and FIG. 2 schematically illustrates a front view with the individual layers shown as blocks. These illustrations are for explanatory purposes and are not limiting. For example, the relative shape, size, geometry, etc. of one or more of the layers therein is not limiting and may have other shape, size, geometry, etc. In general, in some instances the shape, size, geometry, etc. is based on the particular application. In a variation, the detector includes more or less layers. Furthermore, one or more of the layers can be a Si and/or other layer.

The illustrated pSi QD radiation detector 100 includes at least a QD photovoltaic layer 102, a pSi QD layer 104, an acquisition and communication (Acq & Comm) layer 106, and an energy storage layer 108. A non-limiting example of QD's and QD radiation detectors are described in patent application serial number EP 14186022.1, entitled "Encapsulated materials in porous particles," and filed on Sep. 23, 2014, which is incorporated herein by reference in its entirety, and patent application publication number WO 2017/025888 A1, entitled "Quantum Dot Based Imaging Detector," and filed on Aug. 8, 2016, which is incorporated herein by reference in its entirety.

The QD photovoltaic layer 102 is configured to absorb certain radiation and generate photovoltaic charge in response thereto. The pSi QD layer 104 is configured to absorb certain radiation and generate an electrical signal indicative of the electrical energy of the absorbed radiation. QD's in holes in the porous Si interact with the Si to convert the radiation into the charge via electron-hole pair generation and separation. The acquisition and communication layer 106 is configured to measure the electrical signal and route data indicative thereof off the radiation detector. The energy storage layer 108 stores the photovoltaic charge and supplies the acquisition and communication layer 106 with operating power. The stored charge can also be used to supply power to other devices requiring power.

The example radiation detector 100 can be encapsulated, e.g., with a light transparent coating, film, cover, etc. The pSi QD radiation detector 100 can be used individually (as shown) or with one or more other pSi QD radiation detectors 100 and/or other radiation detectors, e.g., in a module or otherwise. The pSi QD radiation detector is well-suited for applications such as unmanned ground or outer space applications and/or other applications where recharging the energy storage layer 108 is not feasible and the QS photovoltaic layer 102 produces enough charge for operating power. Other applications are also contemplated herein.

In FIG. 1, the QD photovoltaic layer 102 is a top layer, with respect to the direction of incident radiation. In a variation, the QD photovoltaic layer 102 is a bottom layer, i.e. below the energy storage layer 108. In another variation, the QD photovoltaic layer 102 extends vertical relative to the pSi QD layer 104, the acquisition and communication layer 106 and energy storage layer 108, along a side (e.g., left, back, right, front) of one more of the pSi QD layer 104, the acquisition and communication layer 106 and energy storage layer 108. In another variation, the radiation detector 100 includes multiple QD photovoltaic layers 102 on one or more sides (e.g., top, bottom, left, back, right, front) of the radiation detector 100, including a same side and/or different sides. In one instance, the additional QD photovoltaic layers increase energy absorption.

Figure 3:
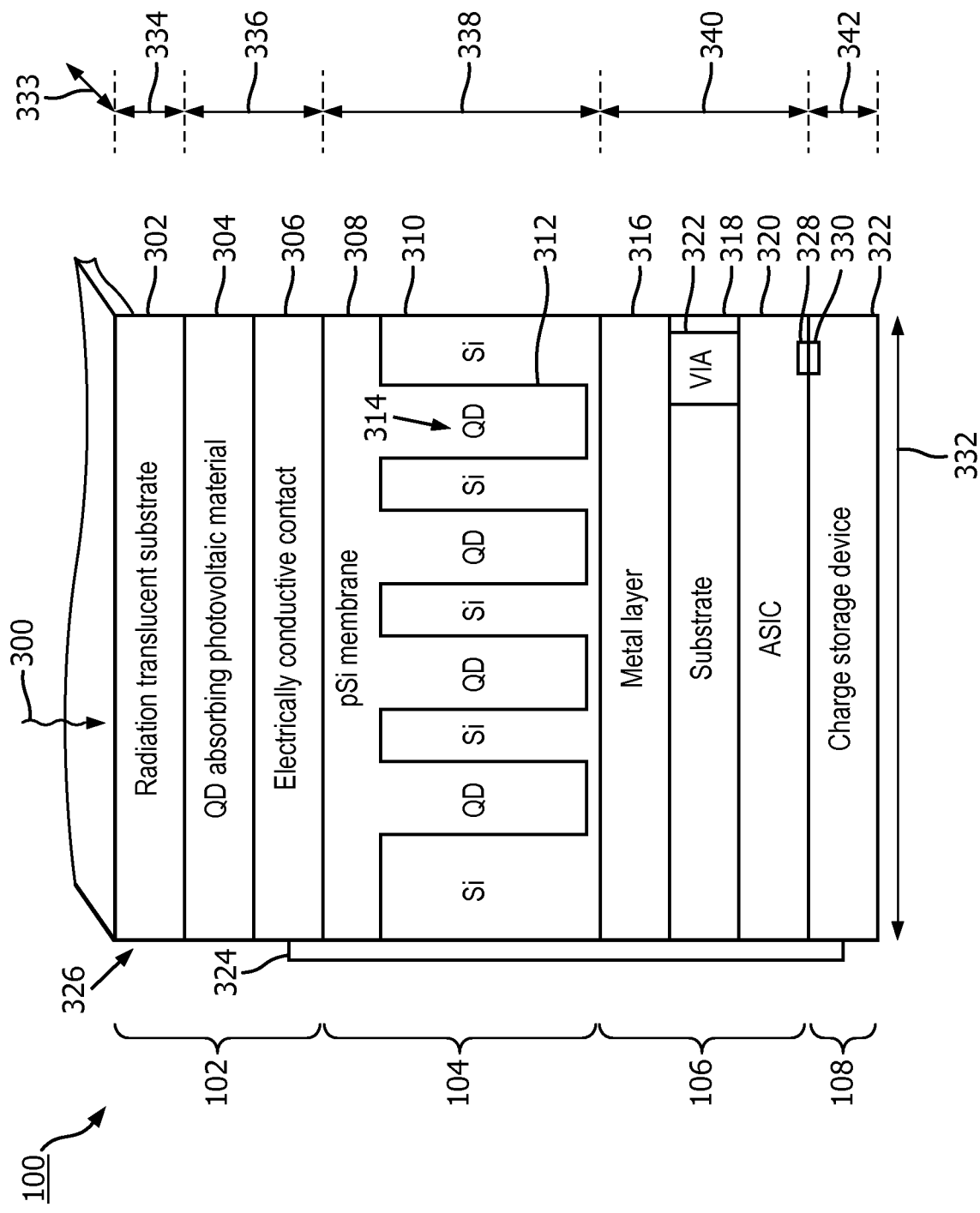
FIG. 3 schematically illustrates a non-limiting example of the QD-pSi radiation detector.

FIG. 3 schematically illustrates a non-limiting example of the pSi QD radiation detector 100 of FIGS. 1 and 2. It is to be understood that the size, shape, etc. is for explanatory purposes and is not limiting.

The QD photovoltaic layer 102 includes a radiation translucent substrate 302, a QD absorbing photovoltaic material 304, an electrically conductive contact 306. The QD photovoltaic layer 102 is a thinner layer relative to the pSi QD layer 104. The QD photovoltaic layer 102 is configured to absorb radiation and, in response thereto, generate photovoltaic power. The illustrated QD photovoltaic layer 102 includes a matrix of QD's tuned to a specific band gap/segment of the light spectrum, e.g., the visible light segment, the infrared (IR) segment, and/or other segment. In one instance, the crystals are tuned through the dimension (e.g., size) of the QD's. Radiation 300 (e.g., photons) is received by the radiation translucent substrate 302.

An example of a QD photovoltaic layer is described in Bhandari, et al., "Thin film solar cells based on the heterojunction of colloidal PbS quantum dots with CdS," Solar Energy Materials & Solar Cells, Volume 117, October 2013, pages 476-482. Another example is described in Nozik, et al., "Semiconductor Quantum Dots and Quantum Dot Arrays and Applications of Multiple Exciton Generation to Third-Generation Photovoltaic Solar Cells," Chemical Reviews, Volume 110, Revision 2010, pages 6873-6890. Another example is described in Semonin, et al., "Quantum Dots for Next Generation Photovoltaics," Materials Today, Volume 15, November 2012, Issue 11. Other configurations are also contemplated herein.

The pSi QD layer 104 includes a pSi membrane 308 with bulk Si material 310 and columnar holes 312 filled with QD's 314 (lead sulfide (PbS) in this example). The pSi QD layer 104 is a thicker layer relative to the QD photovoltaic layer 102. The QD's 314 in the columnar holes 312 and the Si in the bulk Si material 310 interact to convert received radiation 300 into an electrical charge (signal, pulse, etc.) via electron-hole pair generation. An example of the pSi QD layer 104 is described in patent application Ser. No. 62/649,615, entitled "Pixel Definition in a Porous Silicon Quantum Dot Radiation Detector," filed Mar. 29, 2018, which is incorporated herein by reference in its entirety.

Figure 4:
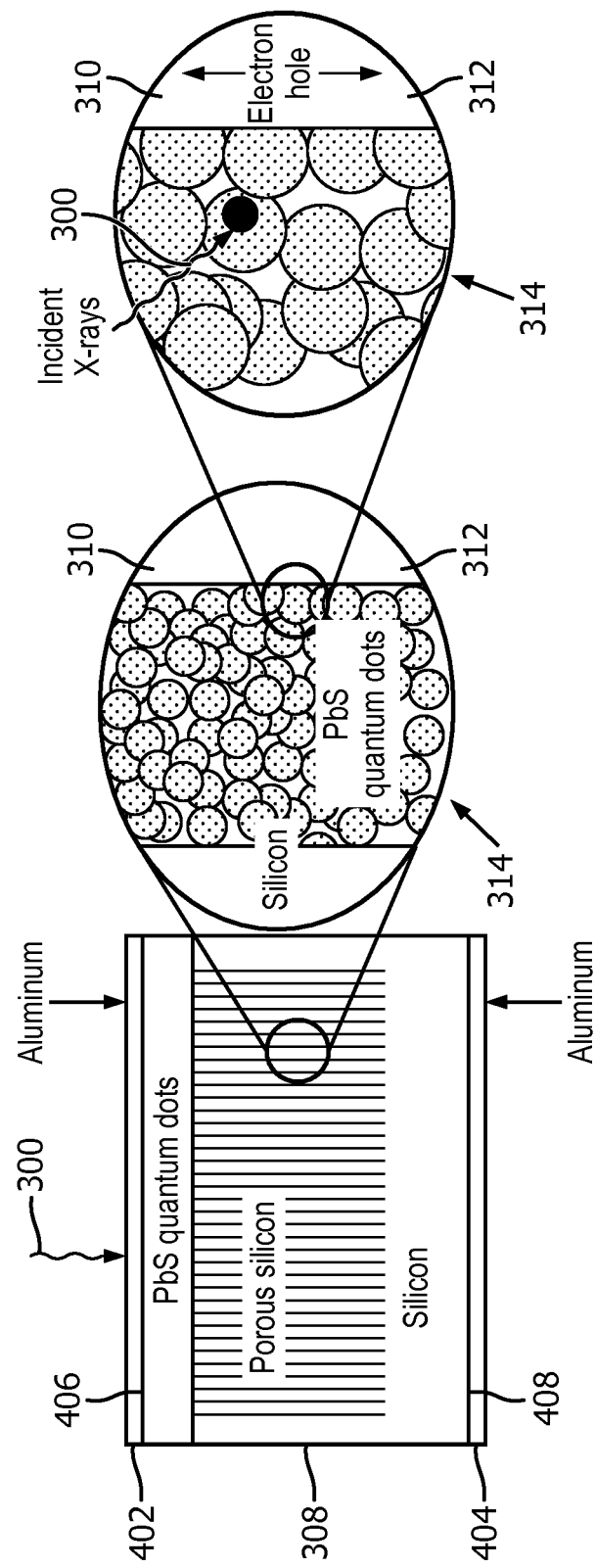
FIG. 4 schematically illustrates an example of the interaction between the QD's and Si in the QD-pSi radiation detector of FIG. 3 to convert received radiation to electrical charge.

Turning briefly to FIG. 4, an example of the interaction between the QD's and Si to convert received radiation to electrical charge is shown. In this example, the pSi QD layer 104 further includes electrical conductors (Aluminum (Al) contacts in this example) 402 and 404 on opposing sides 406 and 408 of the pSi membrane 308. Again, the QD's 314 in the columnar holes 312 and the Si in the bulk Si material 310 interact to convert the received radiation 300 into an electrical charge via electron-hole pair generation Returning to FIG. 3, the acquisition and communication layer 106 includes a metal layer 316, a substrate 318 and circuit 320. The metal layer 316 is electrically coupled to the bulk Si material 310 of the pSi QD layer 104 through an electrically conductive adhesive or the like. An example with pixelation is described in patent application Ser. No. 62/649,615. The circuit 320 (e.g., an application specific integrated circuit (ASIC) or the like) is disposed on the substrate 318. In this example, the signals generated in the pSi QD layer 104 are routed to the circuit 320 by way of through-hole vias (THVs) 319 (e.g., through Si vias) in the substrate 318. In a variation, these signals are routed by way of wires, a flex circuit, or the like. In one instance, the circuit 320 includes readout electronics (not visible) and reads out the measured signals. In another instance, the circuit 320 first processes (e.g., amplify, filter, combine, etc.) the measured signals and then reads out the processed signals. The circuit 320 can be configured to control both data acquisition and data read out.

The energy storage layer 108 includes a charge storage device 322 such as a rechargeable battery, a super capacitor, and/or the like. In this example, the charge generated in the QD photovoltaic layer 102 is routed to the energy storage layer 108 through an electrical conduit 324 such as wires, a flex circuit, or the like disposed at a side 326 of the pSi QD radiation detector 100. In this example, the charge stored in the energy storage layer 108 is routed to the acquisition and communication layer 106 by way of electrical contacts 328 and 330 on the charge storage device 322 and the ASIC 320. In a variation, the charge is by way of wires, a flexible printed circuit board, and the like. In the illustrated example, the circuit 320 controls energy storage layer 108. In a variation, the energy storage layer 108 includes its own circuit for control.

An example of a silicon charge storage device is described in Oakes, et al., "Surface engineered porous silicon for stable, high performance electrochemical supercapacitors," Scientific Reports, Volume 3, October 2013, Article number: 3020. Another example of a charge storage device is described in Gowda, et al., "Building Energy Storage Device on a Single Nanowire," Nano Letters, 11 (8), Jul. 2011, pages 3329-3333. Another example of a charge storage device is described in Gardner, et al., "Integrated on-chip energy storage using passivated nanoporous-silicon electrochemical capacitors," Nano Energy, Volume 25, July 2016, Pages 68-79. Other configurations are also contemplated herein.

In one non-limiting example, a width 332 and a depth 333 of the pSi QD radiation detector 100 are in a range of twenty to fifty millimeters (20-50 mm), a thickness 334 of the radiation translucent substrate is approximately ten microns (10 μm), a thickness 336 of the combination of the QD absorbing photovoltaic material 304 and the electrically conductive contact 306 is approximately one hundred microns (100 μm), a thickness 338 of the pSi membrane is in a range of three hundred to one thousand microns (300-1000 μm), a thickness 340 of the acquisition and communication layer 106 is in a range of seven hundred to one thousand microns (700-1000 μm), and a thickness 342 of the energy storage layer 108 is in a range of a millimeter or larger (1+mm). The pSi QD radiation detector 100 with a different arrangement of layers and/or with layers with different thicknesses is also contemplated herein.

Figure 5:
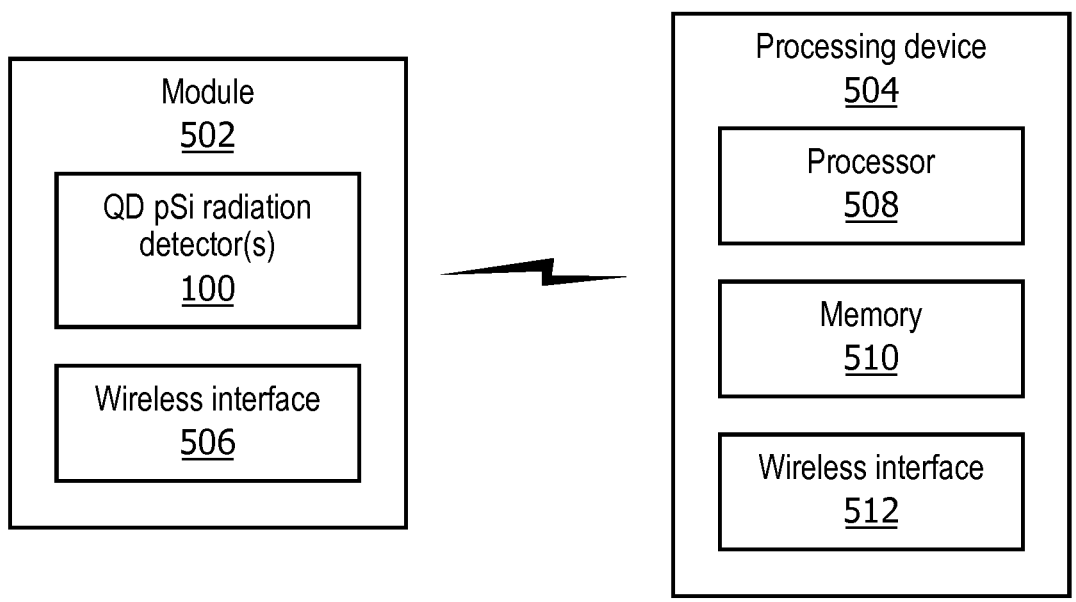
FIG. 5 illustrates an example radiation detection and processing system, which includes the QD-pSi radiation detector of FIG. 1-4, for unmanned ground and/or out space applications.

FIG. 5 illustrates an example radiation detection and processing system. The radiation detection and processing system includes a module 502 with one or more QD-pSi radiation detectors 100 and a processing device 504, which is remote from and part of the one or more QD-pSi radiation detectors.

The one or more QD-pSi radiation detectors 100 are located at an unmanned ground location or in outer space. Generally, at these locations, manually recharging the energy storage device of the energy storage layer 104 is not feasible. However, for lower power application, the charge produced by the QD photovoltaic layer 102 and stored in the energy storage layer 104 provides operating power for the one or more QD-pSi radiation detectors to measure detected radiation and transmit that radiation to another device such as the processing device 504.

In the illustrated example, the module 502 and/or the one or more QD-pSi radiation detectors 100 includes at least a wireless interface 506. In one instance, the wireless interface 506 is configured with a wireless transmitter configured to transmit the data indicative of the measured signal to the processing device 504. In another instance, the wireless interface 506 is configured with a wireless transceiver and not only transmits the data, but also receives data (e.g., a command, a request for data, etc.) from the processing device 504. The wireless interface 506 is also powered by the energy storage layer 108.

The processing device 504 includes a processor 508 (e.g., a central processing unit (CPU), a microprocessor, etc.), a memory device (memory) 510, and a wireless interface 512. The memory device 510 includes one or more algorithms, such as one or more spectral and/or non-spectral algorithms, for processing the data received from the module 502. Such processing, in one example, includes generating an image. In one instance, the processor 508 remains in a standby lower power mode to only send data when triggered by detected radiation, which can save power. The wireless interface 512 is configured with a complementary wireless receiver or wireless transceiver for receiving or receiving and transmitting data (e.g., a command, a request for data, etc.).

Figure 6:
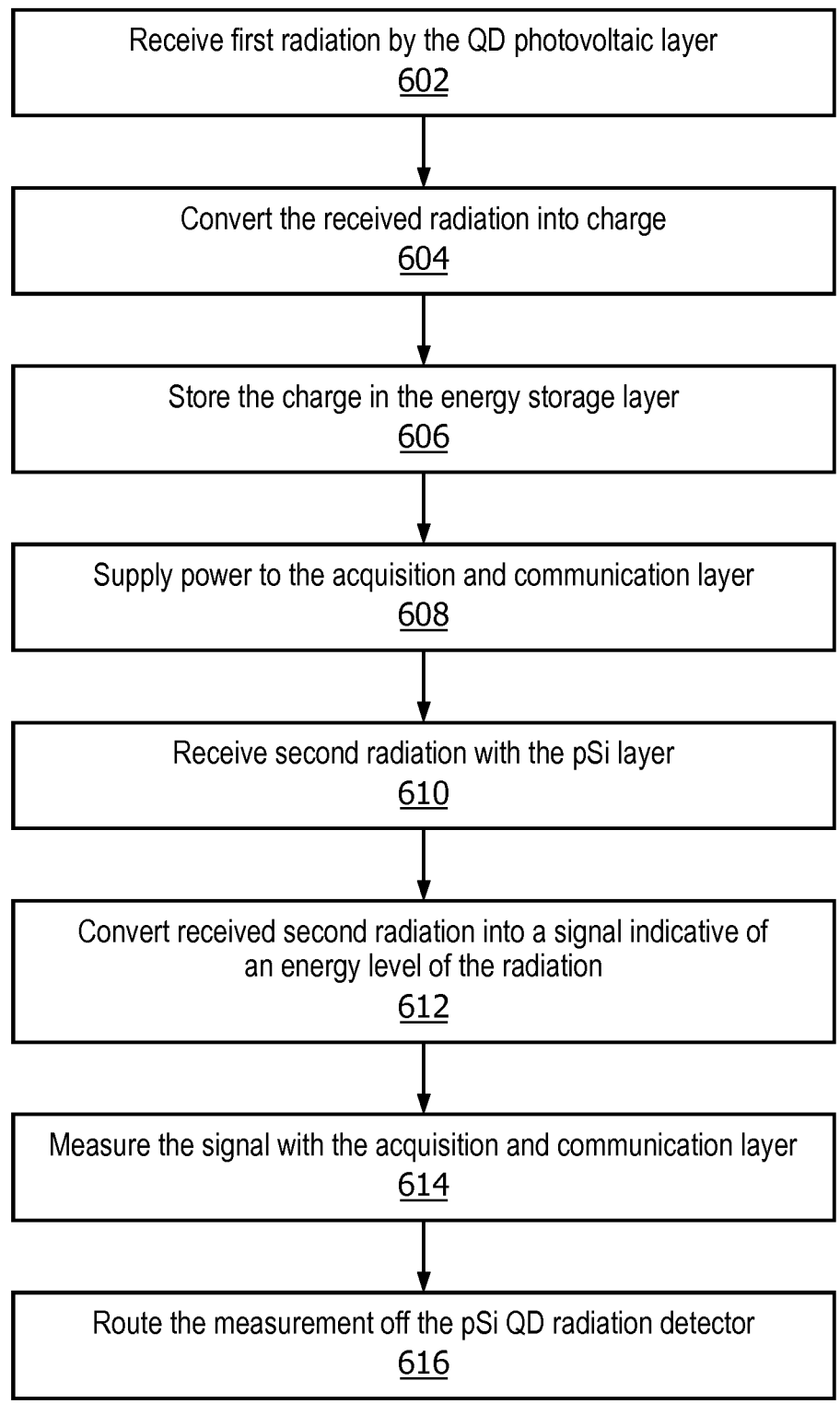
FIG. 6 illustrates an example method in accordance with an embodiment(s) herein.

FIG. 6 illustrates an example method in accordance with an embodiment(s) herein.

At 602, first radiation is received by the QD photovoltaic layer 102 of the pSi QD radiation detector 100.

At 604, the QD photovoltaic layer 102 converts the received radiation into charge.

At 606, the energy storage layer 108 of the pSi QD radiation detector 100 stores the charge.

At 608, the acquisition and communication layer 106 of the pSi QD radiation detector 100 receives operating power from the energy storage layer 108.

At 610, the pSi QD layer 104 of the pSi QD radiation detector 100 receives second radiation.

At 612, the pSi QD layer 104 converts it into a signal indicative of an energy level of the second radiation.

At 614, the acquisition and communication layer 106 measures the signal indicative of an energy level of the second radiation.

At 616, the acquisition and communication layer 106 routes the (raw and/or processed) measurement off the pSi QD radiation detector 100.

In one instance, the routed (raw and/or processed) measurement is processed by a device remote from the pSi QD radiation detector 100.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A radiation detector, comprising:
   a photovoltaic layer with a first side and a second opposing side, wherein the photovoltaic layer is configured to absorb first radiation at the first side and produce electrical charge;
   a porous silicon quantum dot layer disposed at the second side of the photovoltaic layer and configured to receive second radiation and convert the received second radiation into an electrical signal indicative of an energy level of the received second radiation;
   an acquisition and communication layer disposed adjacent to the porous silicon quantum dot layer and configured to provide a measurement of the electrical signal; and
   an energy storage layer disposed adjacent to the acquisition and communication layer and configured to store the electrical charge and supply the stored electrical charge as operating power to the acquisition and communication layer.

2. The radiation detector of claim 1, where the photovoltaic layer includes a quantum dot layer.

3. The radiation detector of claim 1, where the photovoltaic layer is configured to absorb radiation in a band from a group consisting of visible light and infrared light.

4. The radiation detector of claim 1, where the photovoltaic layer includes a quantum dot layer solar cell.

5. The radiation detector of claim 1, wherein the energy storage layer includes one or more cells of a rechargeable battery.

6. The radiation detector of claim 1, wherein the energy storage layer includes a supercapacitor.

7. The radiation detector of claim 1, wherein the acquisition and communication layer includes an integrated circuit.

8. The radiation detector of claim 7, wherein the integrated circuit processes the electrical signal and transmits the processed electrical signal to the device.

9. A radiation detection and processing system, comprising:
   an unmanned ground or celestial radiation detection module, including:
      a photovoltaic layer with a first side and a second opposing side, wherein the photovoltaic layer is configured to absorb first radiation at the first side and produce electrical charge;
      a porous silicon quantum dot layer disposed at the second side of the photovoltaic layer and configured to receive second radiation and convert the received second radiation into an electrical signal indicative of an energy level of the received second radiation;
      an acquisition and communication layer disposed adjacent to the porous silicon quantum dot layer and configured to provide a measurement of the electrical signal; and
      an energy storage layer disposed adjacent to the acquisition and communication layer and configured to store the electrical charge and supply the stored electrical charge as operating power to the acquisition and communication layer; and
   a processing device configured to receive and process the measurement, wherein the processing device is remote from the unmanned ground or celestial radiation detection module.

10. The system of claim 9, wherein the module includes a wireless interface configured to at least wirelessly transmit the measurement to the processing device.

11. The system of claim 9, wherein the processing device includes a wireless interface configured to at least wirelessly receive the measurement from the module.

12. The system of claim 9, wherein the processing device further includes:
   a memory configured to store instructions for processing the data from the module; and
   a processor configured to process the data from the module with the instructions.

13. The system of claim 12, wherein the instructions include one or more spectral algorithms.

14. The system of claim 9, wherein the photovoltaic layer is configured to absorb radiation in a band from a group consisting of visible light and infrared light.

15. The system of claim 9, wherein the photovoltaic layer includes a quantum dot layer solar cell, wherein the photovoltaic layer has a first thickness and the porous silicon quantum dot layer has a second thickness, and the first thickness is smaller than the second thickness.

16. The system of claim 9, wherein the energy storage layer includes a rechargeable battery and/or a supercapacitor.

17. A method of manufacturing a radiation detector, comprising:
   arranging a photovoltaic layer with a first side and a second opposing side, wherein the photovoltaic layer is configured to absorb first radiation at the first side and produce electrical charge;
   arranging a porous silicon quantum dot layer at the second side of the photovoltaic layer, wherein porous silicon quantum dot layer is configured to receive second radiation and convert the received second radiation into an electrical signal indicative of an energy level of the received second radiation;
   arranging an acquisition and communication layer adjacent to the porous silicon quantum dot layer, wherein the acquisition and communication layer is configured to provide a measurement of the electrical signal; and
   arranging an energy storage layer adjacent to the acquisition and communication layer, wherein the energy storage layer is configured to store the electrical charge and supply the stored electrical charge as operating power to the acquisition and communication layer.

18. The method of claim 17, further comprising:
   operating the acquisition and communication layer in a lower power standby mode.

19. The method of claim 17, wherein the acquisition and communication layer receives the operating power only from the energy storage layer.

\* \* \* \* \*